United States Patent
Miyamoto et al.

(10) Patent No.: US 6,362,621 B1
(45) Date of Patent: Mar. 26, 2002

(54) GRADIENT MAGNETIC FIELD MEASUREMENT METHOD AND MRI APPARATUS

(75) Inventors: Shoei Miyamoto; Koichi Oshio, both of Tokyo (JP)

(73) Assignee: GE Yokogawa Medical Systems, Limited A Japan Corporation, Tokyo (JP)

(*) Notice: Subject to any disclaimer, the term of this patent is extended or adjusted under 35 U.S.C. 154(b) by 0 days.

(21) Appl. No.: 09/613,300

(22) Filed: Jul. 10, 2000

(30) Foreign Application Priority Data

Sep. 17, 1999 (JP) .......................................... 11-262927

(51) Int. Cl.$^7$ ................................................. G01V 3/00
(52) U.S. Cl. ........................ 324/312; 324/318; 324/309
(58) Field of Search ................................ 324/312, 318, 324/309, 307, 244

(56) References Cited

U.S. PATENT DOCUMENTS 4,906,929 A * 3/1990 Remp .......................... 324/244

OTHER PUBLICATIONS

"A novel k-space trajectory measurement technique" Y. Zhang, HP Hetherington, EM Stokely, GF Mason, DB Twieg; MRM 39:999-1004 (1998) copy fild herewith.

* cited by examiner

*Primary Examiner*—Hezron Williams
*Assistant Examiner*—Brij B. Shrivastav
(74) *Attorney, Agent, or Firm*—Moonray Kojima

(57) ABSTRACT

In order to accurately measure a gradient magnetic field, a pre-encoding pulse $P_k$ is applied, data $S(k, 1)$–$S(k, T)$ are collected from an FID signal while applying an encoding pulse $G_e$ having a gradient waveform to be measured, and the above steps are repeated K times with the magnitude of the pre-encoding pulse $P_k$ varied; data $D(1,1)$–$D(1, T-1)$, $D(2, 1)$–$D(2, T-1)$, ..., $D(K, 1)$–$D(K, T-1)$ having a phase difference $\Delta\phi$ as an angle are obtained from the collected data $S(1,1)$–$S(1, T)$, $S(2, 1)$–$S(2, T)$, ..., $S(K, 1)$–$S(K, T)$; data having corresponding magnitudes of the encoding pulse $G_e$ are added to obtain added data $d(1)$–$d(T-1)$; gradient magnetic field differences $\Delta G(1)$–$\Delta G(T-1)$ are obtained from the added data $d(1)$–$d(T-1)$; and the gradient magnetic field differences $\Delta G(1)$–$\Delta G(T-1)$ are integrated to obtain a gradient magnetic field $G(1)$–$G(T-1)$.

10 Claims, 5 Drawing Sheets

Gradient magnetic field measurement pulse sequence.

Gradient magnetic field measurement pulse sequence.

Gradient magnetic field measurement pulse sequence.
RF pulse

Gradient magnetic field

GRADIENT MAGNETIC FIELD MEASUREMENT METHOD AND MRI APPARATUS

BACKGROUND OF THE INVENTION

The present invention relates to a gradient magnetic field measurement method and an MRI (magnetic resonance imaging) apparatus, and more particularly to a gradient magnetic field measurement method and an MRI apparatus that can accurately measure a gradient magnetic field actually applied.

FIG. 1 is a diagram for explaining a gradient magnetic field measurement pulse sequence for use in a gradient magnetic field measurement method disclosed in an article entitled "Novel k-space Trajectory Measurement Technique" by Y. Zhang et al., in *Magnetic Resonance in Medicine*, 39: 999–1004 (1998).

The gradient magnetic field measurement pulse sequence J applies an excitation RF pulse R and a slice selective pulse $G_s$, applies a rephasing pulse $G_r$, and collects data S(1)–S(T) from an FID signal while applying an encoding pulse $G_e$ having a spiral gradient waveform.

Next, data D(1)–D(T–1), which have a phase difference $\Delta\phi$ as an angle, are obtained from the collected data S(1)–S(T). In particular, the following calculation is performed:

$$D(t) = S(t) \cdot S(t+1)^*,$$

wherein S(t+1)* represents the conjugate complex of S(t+1).

Then, gradient magnetic field differences $\Delta G(1)$–$\Delta G(T-1)$ are obtained from the data D(1)–D(T–1) having a phase difference $\Delta\phi$ as an angle. In particular, the following calculation is performed:

$$\Delta G(t) = \frac{\arctan\{D(t)\}}{2\pi \cdot \gamma \cdot z \cdot \Delta t},$$

wherein arctan{} is the arc tangent function, $\gamma$ is the gyromagnetic ratio, z is the slice position on the gradient axis, and $\Delta t$ is the time difference between the data S(t) and S(t+1).

Next, the gradient magnetic field differences $\Delta G(1)$–$\Delta G(T-1)$ are integrated to obtain the gradient magnetic field G(1)–G(T–1). In particular, the following calculation is performed:

$$G(\tau) = \sum_{t=1}^{\tau} \Delta G(t).$$

The result of the gradient magnetic field measurement is used for correcting the encoding pulse $G_e$. Moreover, it is used for analyzing eddy current or remanence.

Ideally, the result of the gradient magnetic field measurement with respect to the encoding pulse $G_e$ shown in FIG. 1 would be such as shown in FIG. 2.

However, such a neat result as shown in FIG. 2 is not obtained in practice. Particularly, randomness will occur in a latter portion indicated by a broken line in FIG. 2. This is because a larger encoding pulse $G_e$ increases the difference of gradient magnetic field strength within a sample, resulting in an observed FID signal reduced due to a phase shift generated within the sample. FIG. 3 shows the temporal variation of an FID signal. Basically, the FID signal exponentially decreases with time, but a lot of further smaller minimum portions appear because of the phase shift generated within the sample.

SUMMARY OF THE INVENTION

It is an object of the present invention to provide a gradient magnetic field measurement method and an MRI apparatus that can accurately measure a gradient magnetic field actually applied.

In accordance with a first aspect of the invention, there is provided a gradient magnetic field measurement method comprising the steps of: applying an excitation RF pulse, applying a pre-encoding pulse $P_k$, collecting data S(k, 1)–S(k, T) from an FID signal while applying an encoding pulse $G_e$ having a gradient waveform to be measured, and repeating these steps K times with the magnitude of the pre-encoding pulse $P_k$ varied; obtaining data D(1, 1)–D(1, T–1), D(2, 1)–D(2, T–1), . . . , D(K, 1)–D(K, T–1) having a phase difference $\Delta\phi$ as an angle from the collected data S(1, 1)–S(1, T), S(2, 1)–S(2, T), . . . , S(K, 1)–S(K, T); adding data having corresponding magnitudes of the encoding pulse $G_e$ to obtain added data d(1)–d(T–1); obtaining gradient magnetic field differences $\Delta G(1)$–$\Delta G(T-1)$ from the added data d(1)–d(T–1); and integrating the gradient magnetic field differences $\Delta G(1)$–$\Delta G(T-1)$ to obtain a gradient magnetic field G(1)–G(T–1).

According to the gradient magnetic field measurement method of the first aspect, because the pre-encoding pulse $P_k$ is varied in the collected data S(1, t), . . . , S(K, t), the magnitudes of phase are different. However, if the collected data are converted into data D(1, t), . . . , D(K, t) having a phase difference $\Delta\phi$ as an angle, the data come to have corresponding magnitudes of the encoding pulse $G_e$. On the other hand, because the pre-encoding pulse $P_k$ is varied, the magnitude of phase shift within a sample is varied and portions at which an FID signal is reduced due to the phase shift are different among the data S(1, t), . . . , S(K, t). That is, although an FID signal observed in a certain portion in certain data is small, it is not small in the corresponding portion in other data. Then, adding these data gives d(1)–d(T–1). Since a gradient magnetic field G(1)–G(T–1) is obtained based on such added data d(1)–d(T–1), the gradient magnetic field can be accurately measured.

In accordance with a second aspect of the invention, there is provided an MRI apparatus comprising RF pulse transmitting means, gradient pulse applying means, NMR signal receiving means and data processing means, wherein the RF pulse transmitting means applies an excitation RF pulse, the gradient pulse applying means applies a pre-encoding pulse $P_k$ followed by an encoding pulse $G_e$ having a gradient waveform to be measured, the NMR signal receiving means receives an FID signal while applying the encoding pulse $G_e$ to collect data S(k, 1)–S(k, T), and, from the data S(1, 1)–S(1, T), S(2, 1)–S(2, T), . . . , S(K, 1)–S(K, T) collected by repeating the above operation K times with the magnitude of the pre-encoding pulse $P_k$ varied, the data processing means obtains data D(1, 1)–D(1, T–1), D(2, 1)–D(2, T–1), . . . , D(K, 1)–D(K, T–1) having a phase difference $\Delta\phi$ as an angle, adds data having corresponding magnitudes of the encoding pulse $G_e$ to obtain added data d(1)–d(T–1), obtains gradient magnetic field differences $\Delta G(1)$–$\Delta G(T-1)$ from the added data d(1)–d(T–1), and integrates the gradient magnetic field differences $\Delta G(1)$–$\Delta G(T-1)$ to obtain a gradient magnetic field G(1)–G(T–1).

The MRI apparatus of the second aspect is capable of suitably implementing the gradient magnetic field measurement method as described regarding the first aspect.

In accordance with a third aspect of the invention, there is provided the gradient magnetic field measurement method as described regarding the first aspect, comprising the steps of: defining time points $J_k$ (k=1, ..., K) dispersedly within a period of the encoding pulse $G_e$ having a gradient waveform to be measured; and determining a magnitude of the pre-encoding pulse $P_k$ so as to cancel an integral value of the encoding pulse $G_e$ from its start time point to a time point $J_k$.

Checking on the time points at which an observed FID signal is reduced due to a phase shift within a sample, it is found that the time points are not concentrated at one location but are distributed over a plurality of locations.

The gradient magnetic field measurement method of the third aspect therefore defines a plurality of time points $J_k$ (k=1, ..., K) distributed within a period of the encoding pulse $G_e$, and determines the magnitude of the pre-encoding pulse $P_k$ so as to eliminate the phase shift at each time point $J_k$. Thus, time points at which the FID signal is reduced due to a phase shift within the sample are differentiated among the pre-encoding pulses $P_k$, and therefore the gradient magnetic field can be accurately measured from the added data.

In accordance with a fourth aspect of the invention, there is provided the gradient magnetic field measurement method as described regarding the third aspect, comprising the steps of: applying an excitation RF pulse, but not applying a pre-encoding pulse $P_k$; collecting data S(1)–S(T) from an FID signal while applying an encoding pulse $G_e$ having a gradient waveform to be measured; obtaining a temporal variation of the FID signal intensity from the collected data S(1)–S(T); and defining time points at which the FID signal intensity is minimum as the time points $J_k$ (k=1, ..., K).

The gradient magnetic field measurement method of the fourth aspect searches for time points at each of which a portion of the observed FID signal appears that is reduced due to a phase shift generated within the sample, and determines the magnitude of the pre-encoding pulse $P_k$ so as to eliminate the phase shift at these time points. Thus, since the FID signal can be increased at a portion at which the FID signal would be reduced due to a phase shift without applying a pre-encoding pulse $P_k$, the gradient magnetic field can be accurately measured.

Accordingly, the gradient magnetic field measurement method and MRI apparatus of the present invention provide data compensated for reduction in the FID signal due to phase shifts generated within the sample, i.e., data with a generally good SNR altogether, and can therefore measure a gradient magnetic field accurately.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments shown in the accompanying drawings.

FIRST EMBODIMENT

Figure 4:
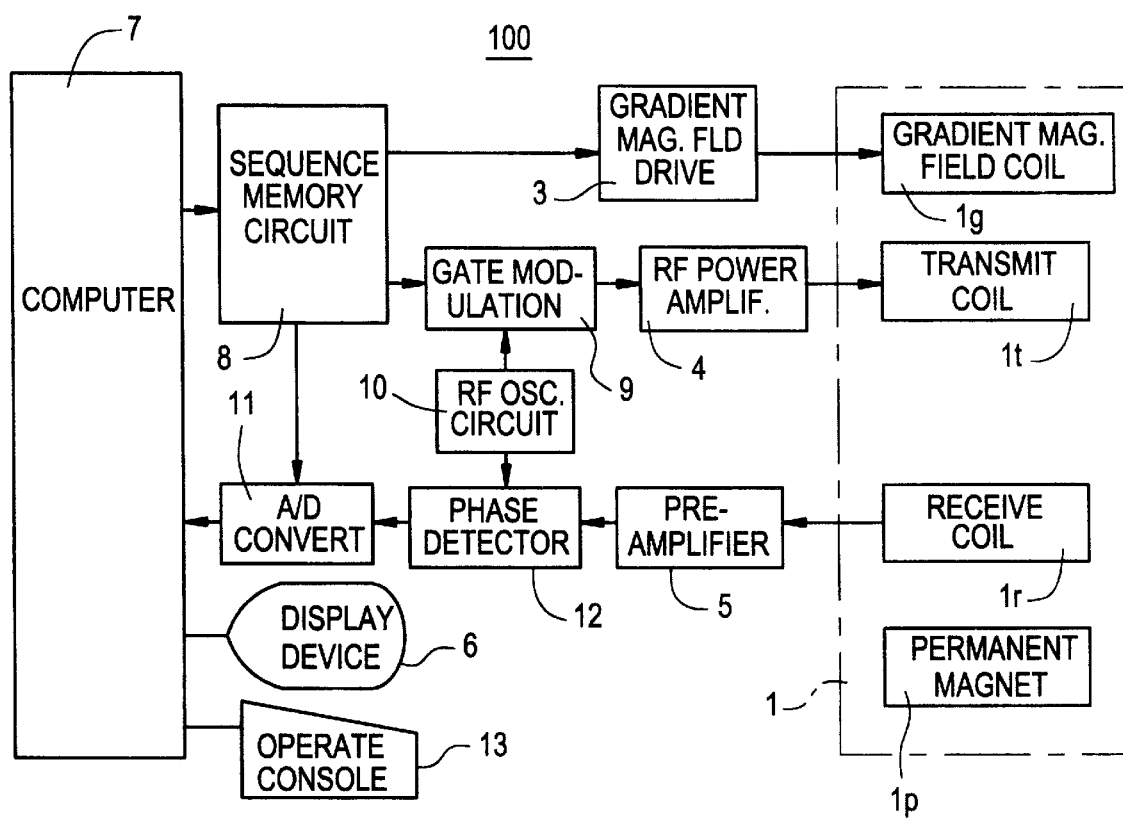
FIG. 4 is a block diagram showing an MRI apparatus in accordance with a first embodiment.

FIG. 4 is a block diagram of an MRI apparatus in accordance with a first embodiment of the present invention.

In the MRI apparatus 100, a magnet assembly 1 has therein an empty portion (bore) for inserting a subject, and surrounding the empty portion are disposed a permanent magnet 1p for applying a static magnetic field having a constant strength $H_0$ to the subject, a gradient magnetic field coil 1g for applying gradient pulses, a transmit coil 1t for supplying an RF pulse to excite spins of atomic nuclei within the subject, and a receive coil 1r for detecting an NMR signal from the subject. The gradient magnetic field coil 1g, transmit coil 1t and receive coil 1r are connected to a gradient magnetic field drive circuit 3, an RF power amplifier 4 and a preamplifier 5, respectively.

It should be noted that a superconductive or normal conductive magnet may be employed instead of the permanent magnet.

A sequence memory circuit 8 operates the gradient magnetic field drive circuit 3 following instructions from a computer 7 based on a stored pulse sequence, to apply a gradient pulse from the gradient magnetic field coil 1g in the magnet assembly 1. The sequence memory circuit 8 also operates a gate modulation circuit 9 to modulate a carrier output signal from an RF oscillation circuit 10 into a pulsed signal having a certain timing and envelope shape. The pulsed signal is applied as an RF pulse to the RF power amplifier 4, power-amplified in the RF power amplifier 4, and applied to the transmit coil 1t in the magnet assembly 1 to selectively excite a desired slice region.

The preamplifier 5 amplifies an NMR signal detected from the subject by the receive coil 1r in the magnet assembly 1, and inputs the signal to a phase detector 12. The phase detector 12 phase-detects the NMR signal from the preamplifier 5 with reference to the carrier output signal from the RF oscillation circuit 10, and supplies the phase-detected signal to an A/D converter 11. The A/D converter 11 converts the phase-detected analog signal into a digital signal, and inputs it to the computer 7.

The computer 7 reads the data from the A/D converter 11, and performs an image reconstruction operation to produce an image of the desired slice region. The image is displayed on a display device 6. The computer 7 is also responsible for overall control such as receiving information input from an operator console 13.

Figure 5:
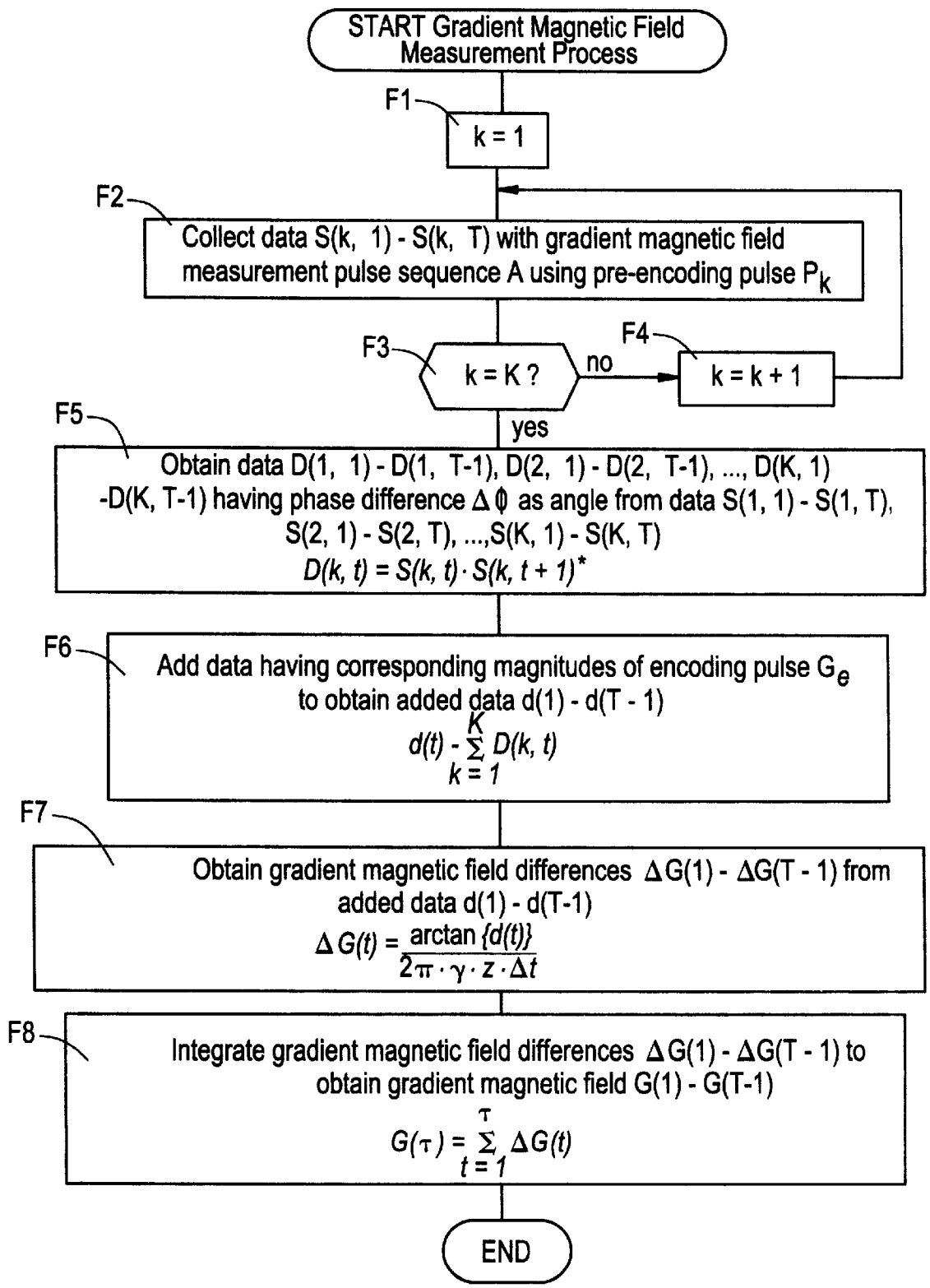
FIG. 5 is a flow chart of a gradient magnetic field measurement process in accordance with the first embodiment.

FIG. 5 is a flow chart of a gradient magnetic field measurement process in accordance with the present invention.

In Step F1, a pre-encoding repetition index k is initialized to "1".

In Step F2, data S(k, 1)–S(k, T) are collected with a gradient magnetic field measurement pulse sequence A shown in FIG. 6.

Figure 6A:
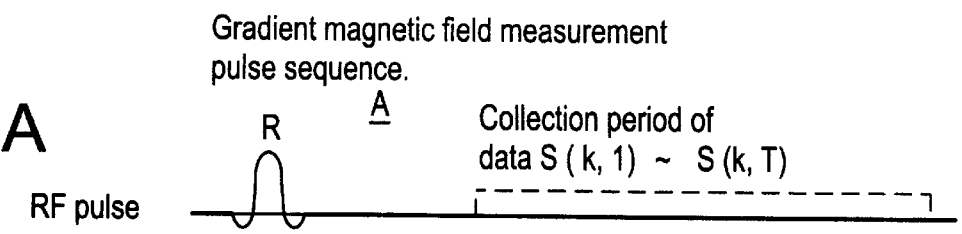
FIGS. 6(A) and 6(B) illustrates a gradient magnetic field measurement pulse sequence A in accordance with the first embodiment.
Figure 6B:
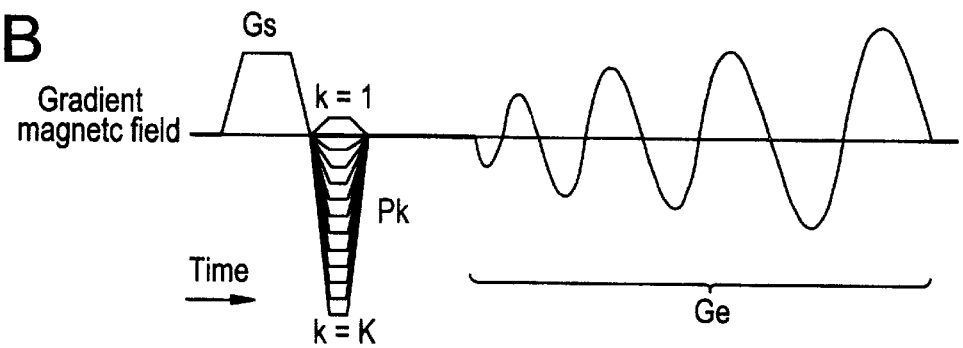

The gradient magnetic field measurement pulse sequence A shown in FIGS. 6(A) and 6(B) applies an excitation RF pulse R and a slice selective pulse $G_s$, applies a pre-encoding pulse $P_k$, and collects the data S(k, 1)–S(k, T) from an FID signal while applying an encoding pulse $G_e$ having a spiral gradient waveform.

Figure 1:
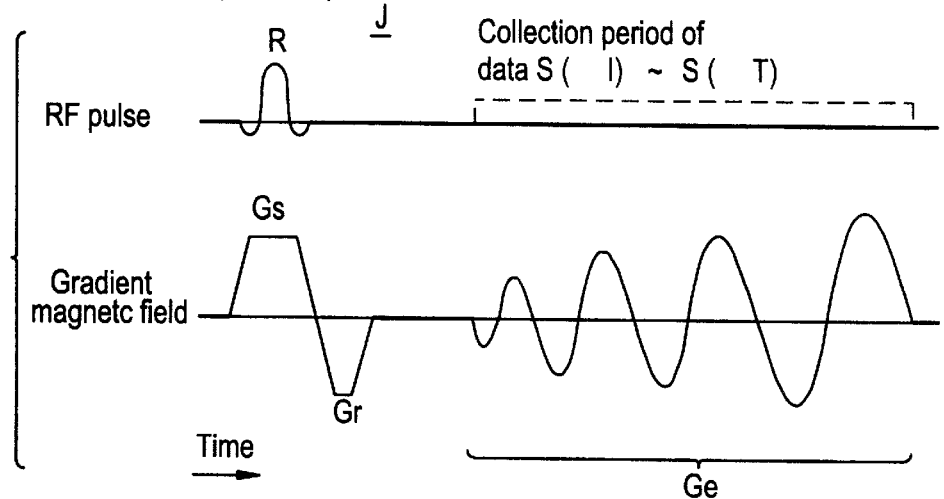
FIG. 1 is a diagram for explaining a conventional gradient magnetic field measurement pulse sequence.
Figure 2:
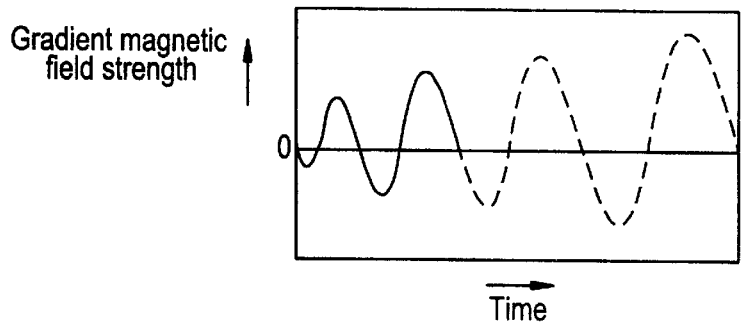
FIG. 2 exemplarily illustrates the result of the conventional gradient magnetic field measurement.
Figure 3:
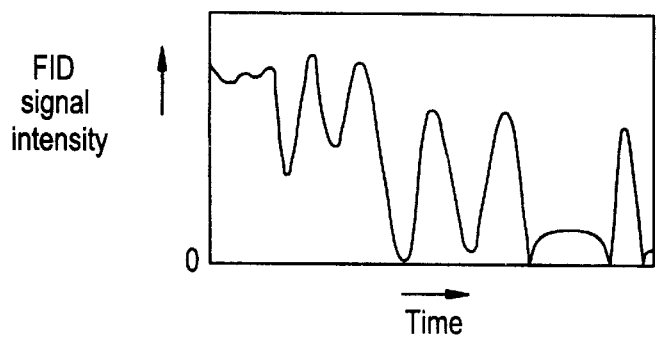
FIG. 3 is a diagram illustrating the presence of portions at which an FID signal is reduced.
Figure 9A:
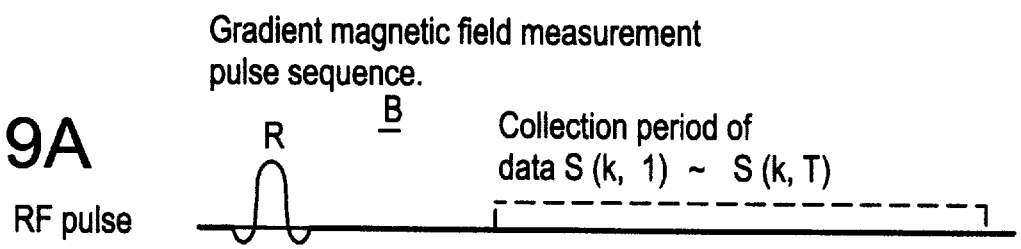
FIGS. 9(A) and 9(B) illustrates a gradient magnetic field measurement pulse sequence B in accordance with a second embodiment.
Figure 9B:
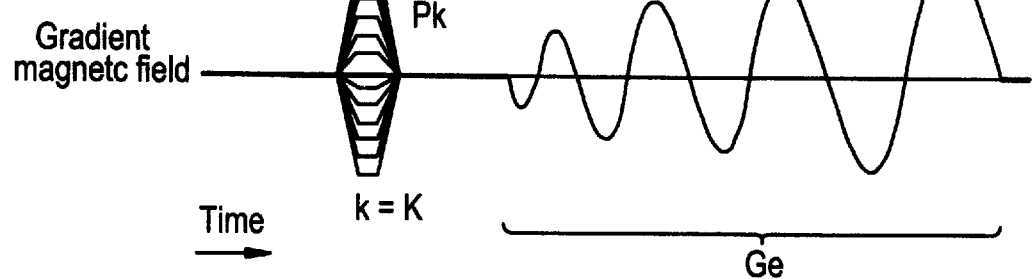

The pre-encoding pulse $P_k$ is the sum of a pulse for encoding (see $P_k$ in FIGS. 9(A) and 9(B) that has an area differentiated according to k, and a rephasing pulse (i.e., $G_r$ in FIG. 1).

At a portion at which an integral value of the pulse for encoding and the encoding pulse $G_e$ approximates to "0", a phase shift within a sample is decreased and reduction in the FID signal can be avoided. Then, it is advantageous for defining time points $J_k$ (k=1, . . . , K) dispersedly within a period of the encoding pulse $G_e$ and determining a magnitude of the pre-encoding pulse $P_k$ so as to cancel the integral value $A_k$ of the encoding pulse $G_e$ from its start time point to a time point $J_k$. Specifically, the area of the encoding pulse for each k can be designed so that the integral value approximates to "0" at least one time at any portion in the encoding pulse $G_e$.

Alternatively, it is possible to apply an excitation RF pulse, but not apply a pre-encoding pulse $P_k$, collect data S(1)–S(T) from an FID signal while applying an encoding pulse $G_e$ having a gradient waveform to be measured, obtain a temporal variation of FID signal intensity from the collected data S(1)–S(T), and define time points at which the FID signal intensity is minimum as the time points $J_k$ (k=1, . . . , K).

In Step F3 and F4, Step F2 is repeated (k=2–K) times. Thus, data S(1, 1)–S(1, T), . . . , S(K, 1)–S(K, T) can be obtained.

In Step F5, data D(1, 1)–D(1, T–1), D(2, 1)–D(2, T–1), . . . , D(K, 1)–D(K, T–1) having a phase difference $\Delta\phi$ as an angle are obtained from the collected data S(1, 1)–S(1, T), . . . , S(K, 1)–S(K, T). In particular, the following calculation is performed:

$$D(k, t) = S(k, t) \cdot S(k, t+1)^*,$$

wherein S(k, t+1)* represents the conjugate complex of S(k, t+1).

In Step F6, data having corresponding magnitudes of the encoding pulse $G_e$ are added to obtain added data d(1)–d(T–1). In particular, the following calculation is performed:

$$d(t) = \sum_{k=1}^{K} D(k, t).$$

In Step F7, gradient magnetic field differences $\Delta G(1)$–$\Delta G(T-1)$ are obtained from the added data d(1)–d(T–1). In particular, the following calculation is performed:

$$\Delta G(t) = \frac{\arctan\{d(t)\}}{2\pi \cdot \gamma \cdot z \cdot \Delta t}.$$

wherein arctan{} is the arc tangent function, $\gamma$ is the gyromagnetic ratio, z is the slice position on the gradient axis, and $\Delta t$ is the time difference between the data S(k, t) and S(k, t+1).

In Step F8, the gradient magnetic field differences $\Delta G(1)$–$\Delta G(T-1)$ are integrated to obtain the gradient magnetic field G(1)–G(T–1). In particular, the following calculation is performed:

$$G(\tau) = \sum_{t=1}^{\tau} \Delta G(t).$$

Figure 7:
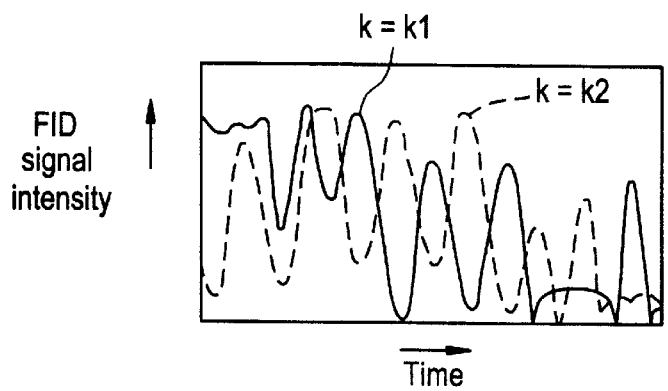
FIG. 7 is a diagram illustrating that portions at which the FID signal is reduced are varied with difference of a pre-encoding pulse $P_k$.
Figure 8:
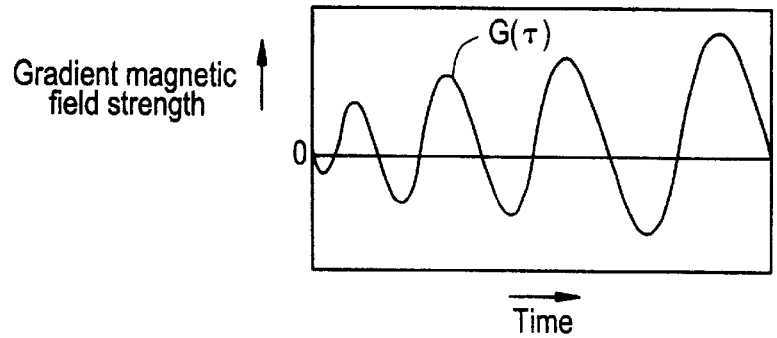
FIG. 8 exemplarily illustrates the result of the gradient magnetic field measurement in accordance with the first embodiment.

According to the gradient magnetic field measurement process in the MRI apparatus 100 as above, since the pre-encoding pulse $P_k$ is varied, the magnitude of phase shift within a sample is varied and portions at which an FID signal is reduced due to the phase shift are different among the data S(1, t), . . . , S(K, t). That is, as shown in FIG. 7, while an FID signal is small in a certain portion when k=k1, it is not small in the corresponding portion when k=k2. Therefore, when these data are added, data can be obtained with the FID signal not reduced in any portion. Thus, the gradient magnetic field measurement can produce an accurate result as shown in FIG. 8.

SECOND EMBODIMENT

A gradient magnetic field measurement pulse sequence B shown in FIGS. 9(A) and 9(B) may be employed using a small sample (for example, a sphere 10 cm in diameter).

In the gradient magnetic field measurement pulse sequence B in FIGS. 9(A) and 9(B), since the sample is small and the need to select a slice is eliminated, a slice selective pulse ($G_s$ in FIGS. 6(A) and 6(B)) is not applied. Moreover, since a rephasing pulse ($G_r$ in FIG. 1) is not required, the pre-encoding pulse $P_k$ consists only of the pulse for encoding.

Many widely different embodiments of the invention may be configured without departing from the spirit and the scope of the present invention. It should be understood that the present invention is not limited to the specific embodiments described in the specification, except as defined in the appended claims.

What is claimed is:

1. A gradient magnetic field measurement method comprising the steps of: when T is the number of times to sample data from one FID signal and K is a natural number equal to or greater than 2, applying an excitation RF pulse, applying a pre-encoding pulse $P_k$, collecting data S(k, 1)–S(k, T) from an FID signal while applying an encoding pulse $G_e$ having a gradient waveform to be measured, and repeating these steps K times with the magnitude of said pre-encoding pulse $P_k$ varied; obtaining data D(1, 1)–D(1, T–1), D(2, 1)–D(2, T–1), . . . , D(K, 1)–D(K, T–1) having a phase difference $\Delta\phi$ as an angle from said collected data S(1, 1)–S(1, T), S(2, 1)–S(2, T), . . . , S(K, 1)–S(K, T); adding data having corresponding magnitudes of said encoding pulse $G_e$ to obtain added data d(1)–d(T–1); obtaining gradient magnetic field differences $\Delta G(1)$–$\Delta G(T-1)$ from said added data d(1)–d(T–1); and integrating said gradient magnetic field differences $\Delta G(1)$–$\Delta G(T-1)$ to obtain a gradient magnetic field G(1)–G(T–1).

2. The gradient magnetic field measurement method as defined in claim 1, comprising the steps of: defining time points $J_k$ (k=1, . . . , K) dispersedly within a period of said encoding pulse $G_e$ having a gradient waveform to be measured; and determining a magnitude of said pre-encoding pulse $P_k$ so as to cancel an integral value of said encoding pulse $G_e$ from its start time point to a time point $J_k$.

3. The gradient magnetic field measurement method as defined in claim 2, comprising the steps of: applying an excitation RF pulse, but not applying a pre-encoding pulse $P_k$; collecting data S(1)–S(T) from an FID signal while applying an encoding pulse $G_e$ having a gradient waveform to be measured; obtaining a temporal variation of the FID signal intensity from said collected data S(1)–S(T); and defining time points at which the FID signal intensity is minimum as said time points $J_k$ (k=1, ..., K).

4. The gradient magnetic field measurement method as defined in claim 1, wherein a slice selective pulse is also applied when said excitation RF pulse is applied.

5. The gradient magnetic field measurement method as defined in claim 1, wherein a sample for the gradient magnetic field measurement is incorporated.

6. An MRI apparatus comprising RF pulse transmitting means, gradient pulse applying means, NMR signal receiving means and data processing means, wherein:

when T is the number of times to sample data from one FID signal and K is a natural number equal to or greater than 2, said RF pulse transmitting means applies an excitation RF pulse, said gradient pulse applying means applies a pre-encoding pulse $P_k$ followed by an encoding pulse $G_e$ having a gradient waveform to be measured, said NMR signal receiving means receives an FID signal while applying said encoding pulse $G_e$ to collect data S(k, 1)–S(k, T), and, from the data S(1, 1)–S(1, T), S(2, 1)–S(2, T), ..., S(K, 1)–S(K, T) collected by repeating the above operation K times with the magnitude of said pre-encoding pulse $P_k$ varied, said data processing means obtains data D(1, 1)–D(1, T−1), D(2, 1)–D(2, T−1), ..., D(K, 1)–D(K, T−1) having a phase difference $\Delta\phi$ as an angle, adds data having corresponding magnitudes of said encoding pulse $G_e$ to obtain added data d(1)–d(T−1), obtains gradient magnetic field differences $\Delta G(1)$–$\Delta G(T-1)$ from said added data d(1)–d(T−1), and integrates said gradient magnetic field differences $\Delta G(1)$–$\Delta G(T-1)$ to obtain a gradient magnetic field G(1)–G(T−1).

7. The MRI apparatus as defined in claim 6, wherein time points $J_k$ (k=1, ..., K) are defined dispersedly within a period of said encoding pulse $G_e$ having a gradient waveform to be measured; and a magnitude of said pre-encoding pulse $P_k$ is determined so as to cancel an integral value of said encoding pulse $G_e$ from its start time point to a time point $J_k$.

8. The MRI apparatus as defined in claim 7, wherein an excitation RF pulse is applied, but a pre-encoding pulse $P_k$ is not applied, data S(1)–S(T) are collected from an FID signal while applying an encoding pulse $G_e$ having a gradient waveform to be measured, a temporal variation of the FID signal intensity is obtained from said collected data S(1)–S(T), and time points at which the FID signal intensity is minimum are defined as said time points $J_k$ (k=1, ..., K).

9. The MRI apparatus as defined in claim 6, wherein a slice selective pulse is also applied when said excitation RF pulse is applied.

10. The MRI apparatus as defined in claim 6, further comprising a sample for the gradient magnetic field measurement.

* * * * *